United States Patent [19]
Tiemeijer

[11] Patent Number: 5,692,001
[45] Date of Patent: Nov. 25, 1997

[54] OPTOELECTRONIC SEMICONDUCTOR DEVICE WITH A SEMICONDUCTOR DIODE LASER

[75] Inventor: Lukas F. Tiemeijer, Eindhoven, Netherlands

[73] Assignee: U.S. Philips Corporation, New York, N.Y.

[21] Appl. No.: 523,066

[22] Filed: Sep. 1, 1995

[30] Foreign Application Priority Data

Sep. 6, 1994 [EP] European Pat. Off. ............... 94202537

[51] Int. Cl.$^6$ ..................... H01S 3/19; H01S 3/08
[52] U.S. Cl. ........................... 372/44; 372/50; 372/97; 372/96; 385/131; 359/346
[58] Field of Search ..................... 372/44, 50, 97, 372/96; 385/14, 131; 359/344, 346

[56] References Cited

U.S. PATENT DOCUMENTS

| | | | |
|---|---|---|---|
| 3,701,044 | 10/1972 | Paoli et al. | 359/344 |
| 4,730,327 | 3/1988 | Gordon | 372/50 |
| 4,827,482 | 5/1989 | Towe et al. | 372/94 |
| 5,285,465 | 2/1994 | Schilling et al. | 372/50 |
| 5,469,460 | 11/1995 | Van Roijen et al. | 372/94 |

FOREIGN PATENT DOCUMENTS

| | | | |
|---|---|---|---|
| 59-100583 | 6/1984 | Japan | 372/50 |
| 62-15879 | 1/1987 | Japan | 372/50 |

OTHER PUBLICATIONS

Pennings, E.C.M. et al., "Reflection Properties of Multimode Interference Devices" IEEE Phot. Tech. Lett. 6(6) Jun. 1, 1994, pp.715–718.

Primary Examiner—Rodney B. Bovernick
Assistant Examiner—Yisun Song
Attorney, Agent, or Firm—Steven R. Biren

[57] ABSTRACT

An optoelectronic semiconductor device with at least one laser and two mutually parallel, strip-shaped active regions, whose ends are optically coupled at one side, is a very suitable radiation source or amplifier, for example as a tunable radiation source. More than one kind of radiation is often present in such a device, whereas it is desirable for only one kind of radiation to pass through a gate of the device. To achieve this in prior devices, an additional component, such as a filter or isolator, is necessary. In a device according to the invention, the ends of the active regions are coupled to a first and a second radiation coupler at two respective ends, the first radiation coupler forming a first and a second gate, and the second radiation coupler forming a third and a fourth gate for the device, while the geometry and material properties of the radiation couplers and the active regions are so chosen that electromagnetic radiation generated, amplified, or reflected in the device during operation moves diagonally through device owing to constructive interference. In such a device, at most one kind of radiation will pass through a gate.

8 Claims, 3 Drawing Sheets

OPTOELECTRONIC SEMICONDUCTOR DEVICE WITH A SEMICONDUCTOR DIODE LASER

BACKGROUND OF THE INVENTION

The invention relates to an optoelectronic semiconductor device—often called device for short hereinafter—with a semiconductor diode laser—often called laser for short hereinafter—with two mutually parallel strip-shaped active regions whose ends are optically interconnected at one side.

Such a device is particularly suitable inter alia for use as a radiation source or amplifier in, for example, an optical glass fibre system. In this application, the signal wavelength often lies between 1 and 1.5 μm. The semiconductor material system which corresponds therewith is InGaAsP/InP. In the present Application, accordingly, the term laser is understood to include both a radiation-emitting laser and a laser amplifier.

Such a device is known from U.S. Pat. No. 5,285,465 published on the 8th Feb. 1992. An optically controlled laser is described therein with two strip-shaped active regions which are optically coupled at one end into a third strip-shaped active region. This laser is capable of emitting radiation with a wavelength $\lambda_1$ which corresponds to the material composition of the laser. When an external radiation with a wavelength $\lambda_2$ is introduced into this laser, the laser emits radiation whose wavelength ($\lambda_1$ or $\lambda_2$) depends on the power of the external radiation.

A disadvantage of a device such as the known one is that, in the location where the amplified radiation is put in or delivered, other radiation is often present as well, such as reflected radiation (of the same wavelength) or radiation of a different wavelength from the radiation which is or is to be amplified. It is often desirable in practice that not more than one kind of radiation issues from one gate of the device. An additional provision is necessary then in order to achieve this. For example, this is an optical filter when radiation of different wavelengths is present, while in the case of reflected radiation this is, for example, an optical isolator. Such an additional provision renders the device comparatively complicated, expensive, and most of all difficult to integrate monolithically.

SUMMARY OF THE INVENTION

The present invention has for its object inter alia to provide an optoelectronic semiconductor device of the kind mentioned in the opening paragraph which does not have the above disadvantage, or at least to a much lesser extent, so that not more than one kind of radiation can issue from one gate, while it is simple, inexpensive, and easy to integrate monolithically.

According to the invention, an optoelectronic device of the kind mentioned in the opening paragraph is for this purpose characterized in that the ends of the active regions on both sides are coupled to a first and a second radiation coupler, respectively—often referred to as coupler for short hereinafter—, wherein the fast coupler forms a first and a second gate and the second coupler a third and a fourth gate for the device, and the geometry and material properties of the couplers and the active regions are so chosen that radiation generated, amplified, or reflected in the device during operation moves diagonally through the device as a result of constructive interference.

In such a device, radiation entering at, for example, the first gate will leave the device only through the fourth gate which is situated diagonally relative to the first gate. It is achieved that radiation generated, amplified, or reflected in the device can enter or leave the device in four locations in that the two couplers are coupled to the two active regions. It is further achieved in the device according to the invention that said radiation distributes itself over the two active regions, and accordingly both portions are amplified. Since the gain and the optical path length are suitably chosen in each of the active regions, it is achieved that said radiation moves mainly crosswise through the device as a result of constructive interference. This is achieved through a suitable choice of the structure, dimensions, and compositions of the active regions, and through a suitable choice of the operating conditions, mainly the current through each of the active regions. This latter quantity determines in particular the amplification of the portion of the radiation passing through each active region. The optical path length is determined in particular by the other parameters mentioned. The optical path length may also be adjusted by means of a current change. This is also possible by means of an additional current supply in each active region whereby, independently of the gain, the optical path length can be adjusted. At most one kind of radiation accordingly issues from one gate of a device according to the invention, although two kinds of radiation may be present in the device. The device according to the invention thus requires no additional provisions such as an isolator or a filter for achieving this object. The device according to the invention is thus not only comparatively simple and inexpensive, but also readily integrated monolithically. It is noted that the term "gate" is here understood to mean a portion of the device where radiation enters or leaves the device, and which may or may not be in the form of a radiation waveguide.

In an important embodiment, the first and the second radiation coupler are 3-dB radiation couplers, and the strip-shaped active regions have substantially the same dimensions and comprise the same materials. In that case the active regions are identical and may have a common current supply. Indeed, exactly 50% of the radiation will be present in each of the active regions, and both the gain and the optical path length are the same for the two active regions, while a diagonal movement of the radiation through the device is achieved by means of constructional interference. Identical strip-shaped regions are comparatively easy to realise, in particular when they are manufactured next to one another in a single semiconductor body. The same is true for the radiation couplers, and accordingly the device according to the invention is preferably formed integrally within a single semiconductor body. The device according to the invention is then comparatively simple and easy to manufacture, also owing to a common, identical current supply for the active regions. It is alternatively possible also in this case, however, to use separate current supplies, and accordingly two lasers, whereby any small differences in geometry and composition of the active regions can be compensated by means of different current supplies to the active regions.

The radiation couplers may be of various types, such as the evanescent waveguide type. Preferably, the radiation couplers are so-called MMI (=Multi Mode Interference) couplers; such couplers are particularly suitable because they have wide tolerances in their manufacture, especially in the width direction. They are also very suitable as 3-dB couplers.

If it is to be used as an optically controllable laser amplifier, a device according to the invention preferably has all its gates provided with antireflection means, preferably in the form of an antireflection layer. Preferably, the active regions in such an amplifier are provided with a periodic variation in the refractive index in longitudinal direction. This modification comprises a laser amplifier of the DFB (=Distributed FeedBack) or DBR (=Distributed Bragg Reflector) type, in which reflection occurs at a grating. Since reflected radiation moves in a direction opposed and diagonal to, for example, radiation to be amplified in the case of active regions of the DFB type, the radiation reflected in the device will not end up in that gate through which the radiation to be amplified enters the device.

The latter modification is also particularly suitable for use in a ring amplifier in which (portions of) the radiation to be amplified move(s) in opposite directions through the amplifier and where it is undesirable for reflections in the amplifier to enter the ring. Such a ring amplifier is, for example, a polarization-insensitive ring amplifier.

In a further modification of a device according to the invention, the first and second gates are provided with antireflection means, the second gate comprises a radiation waveguide which is provided with a periodic variation in the refractive index in its longitudinal direction, the third gate of the second radiation coupler is provided with reflection means, and the fourth gate of the second radiation coupler is provided with further means for absorbing or scattering electromagnetic radiation. This modification is an optically controllable laser in which the radiation to be amplified with a first wavelength leaves the device through the third gate, and control radiation with a second wavelength enters the device through the first gate and is absorbed or scattered in the fourth gate. No additional filter is accordingly required for separating the two kinds of radiation, which usually have different wavelengths.

In another modification, the first and fourth gates are provided with antireflection means, and the second and third gates are provided with reflection means. This modification comprises a laser amplifier in which, besides the radiation to be amplified, there is also radiation which provides a round-trip gain, in contrast to what is usual. Generally, and preferably, the two kinds of radiation do not have the same wavelength. The radiation to be amplified moves from the first to the fourth gate, the radiation providing the round-trip gain moves between the second and the third gate. Again, at most one kind of radiation issues from each gate, and no additional provision, i.e. a filter, is accordingly necessary.

As was noted above, the laser with the strip-shaped active regions and the couplers are preferably integrated in a semiconductor body. This is connected with the requirement that the optical lengths of all possible paths must be accurately defined and stable. This requires, for example, a homogeneous and stable temperature in the device, which can be better realised when the device is integrated within one semiconductor body. Especially the second and further modifications mentioned above are very difficult to manufacture from discrete components. Preferably, said semiconductor body comprises a semiconductor substrate of a first conductivity type, on which substrate a first cladding layer of the first conductivity type, an active layer, and a second cladding layer of a second conductivity type opposed to the first are present within a first region, while the substrate and the second cladding layer are provided with electrical connections and two mutually parallel strip-shaped active regions are present within the active layer, and on which substrate, within a second and third region situated on either side of the first region, a radiation-guiding layer is present which lies between two further cladding layers, which adjoins the active layer laterally, and in which a first radiation coupler and a second radiation coupler are formed, respectively.

Preferably, the semiconductor layers have been removed outside a first strip which extends over all three regions, and three further strips lying in the same extended direction are present within said first strip, within which further strips the semiconductor layers have also been removed and which further strips lie entirely within the first region, partly within the first, second and third regions, and entirely within the third region, respectively. The device in this case comprises four gates in the form of four radiation waveguides which are formed between the first and the third further strip and the edges of the first strip, two MMI couplers lying within the first strip between the first and second and between the second and third further strips, and two strip-shaped active regions lying within the first region between the second further strip and the edges of the first strip. Such a device is comparatively easy to manufacture through the use of (selective) epitaxy, photolithography, and etching.

The substrate and the cladding layers preferably comprise InP and the active layer and the radiation-guiding layers InGaAsP for use in the wavelength range from 1 to 1.6 µm.

BRIEF DESCRIPTION OF THE DRAWING

The invention will now be explained in more detail with reference to four embodiments and the accompanying drawing, in which.

The Figures are diagrammatic and not drawn to scale, the dimensions of the radiation-emitting semiconductor diode being particularly exaggerated for greater clarity. Corresponding components have been given the same reference numerals in the various Figures as a rule.

DESCRIPTION OF THE PREFERRED EMBODIMENTS

Figure 1:
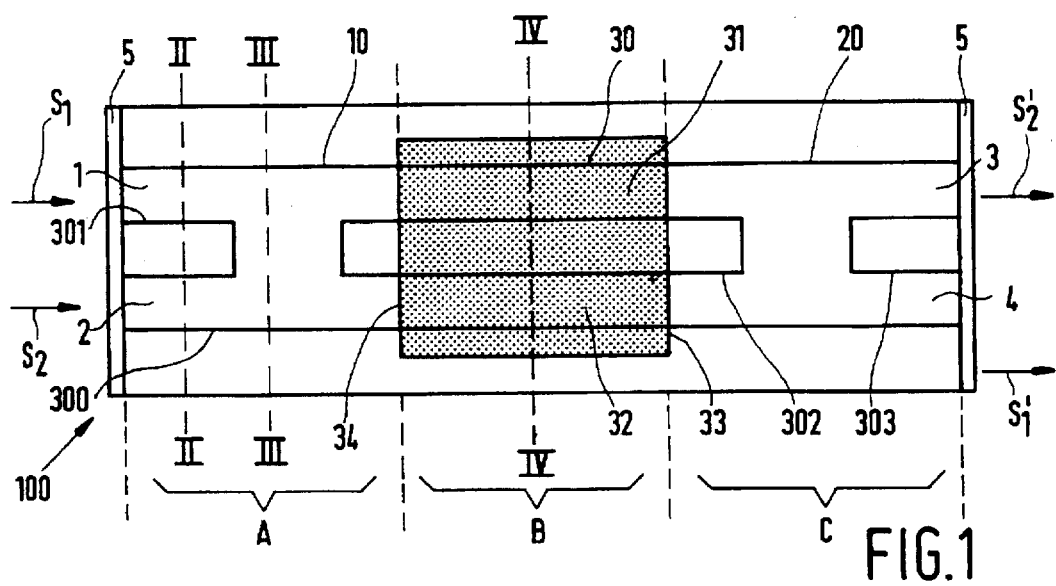
FIG. 1 diagrammatically and in plan view shows a first embodiment of a device according to the invention.
Figure 2:
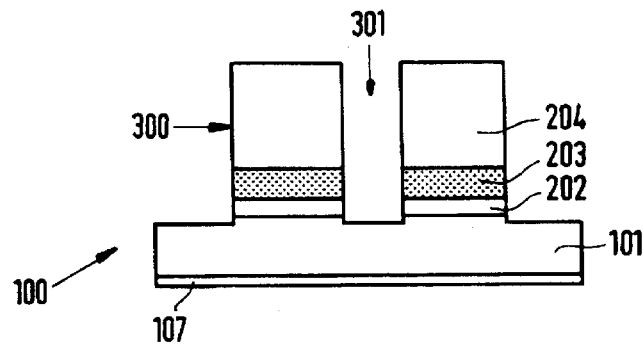
FIG. 2 shows the device of FIG. 1 diagrammatically and in cross-section taken on the line II—II.
Figure 3:
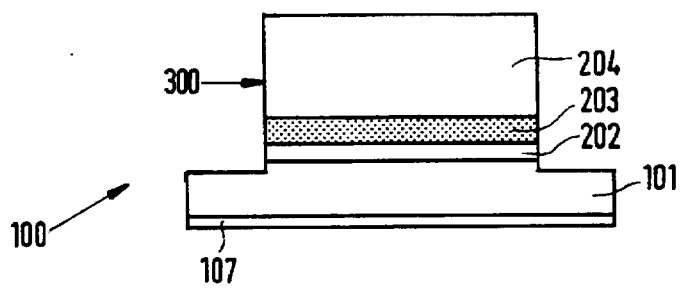
FIG. 3 shows the device of FIG. 1 diagrammatically and in cross-section taken on the line III—III.
Figure 4:
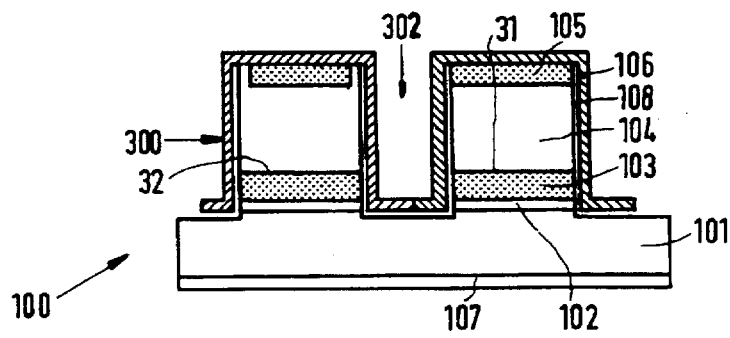
FIG. 4 shows the device of FIG. 1 diagrammatically and in cross-section taken on the line IV—IV.

FIG. 1 is a diagrammatic plan view of a first embodiment of an optoelectronic semiconductor device according to the invention. FIGS. 2, 3 and 4 show the device of FIG. 1 in cross-section taken on the lines II—II, III—III, and IV—IV, respectively. The device 100 (see FIG. 1) comprises a semiconductor diode laser 30 with two mutually parallel, strip-shaped active regions 31, 32 whose ends are optically interconnected at one side. According to the invention, the ends of the active regions 31, 32 are optically coupled at both sides by means of a first radiation coupler 10 and a second radiation coupler 20, respectively. These couplers 10, 20 have a first and a second gate 1, 2, and a third and a fourth gate 3, 4, respectively, through which radiation can enter or leave the device 100. According to the invention, furthermore, the geometry and the material properties of the active regions 31, 32 and the couplers 10, 20 are so chosen that electromagnetic radiation generated, amplified or reflected in the device 100 during operation moves diagonally through the device 100, i.e. from gate 1 to gate 4 (or vice versa) or from gate 2 to gate 3 (or vice versa) owing to constructive interference. In such a construction, radiation $S_1$ which enters the device 100, for example, at gate 1, is split up into two portions which each pass through one of the active regions 31, 32 and are amplified there, after which the two (amplified) portions recombine to form $S_1'$ and leave the device 100 at gate 4 in the example given. Similarly, radiation $S_2$ moves from gate 2 to gate 3. In such a device 100, accordingly, two kinds of radiation $S_1$, $S_2$ may be amplified in the same manner, while they leave the device 100 separately and no additional provisions are accordingly required for separating the one kind of radiation $S_1$ from the other kind $S_2$, for example, by means of a filter.

Such a device 100 is particularly suitable for use as an optically controllable laser amplifier in an optical glass fibre communication system. The intensity of the signal beam $S_2$ is modulated in that the intensity of the control beam $S_1$ is modulated. In the present example, the laser amplifier is not of the Fabry-Pérot type but of the travelling waveguide type, and the ends of the gates 1, 2, 3, 4 are provided with antireflection means 5 for this purpose, here in the form of a 0.18 μm thick antireflection layer 5 made of silicon oxynitride. In this example, furthermore, the couplers 10, 20 are 3-dB couplers, and the active regions 31, 32 have substantially the same dimensions and comprise the same (semiconductor) materials. The couplers 10, 20 in this example are so-called Multi Mode Interference couplers which are comparatively easy to manufacture.

The device 100 here comprises a semiconductor body 100 with a semiconductor substrate 101 (see FIGS. 1 to 4) of a first, here the n-conductivity type and made of InP, on which are present within a first region B in that order a first InP cladding layer 102 of the first, so here the n-conductivity type, an active layer 103 of InGaAsP whose composition corresponds to a radiation of 1.3 μm, and a second InP cladding layer 104 of a second conductivity type opposed to the first, so here the p-type. The substrate 101 and the second cladding layer 104 are provided with electrical connection means 105, 106, 107 which here comprise two metal layers 106, 107 and a contact layer 105 which is made of p-InGaAsP in this case whose composition corresponds to a radiation of 1.5 μm. With the exception of the upper side of the contact layer 105, the metal layer 106 is separated from the semiconductor body 100 by an insulating $SiO_2$ layer 108. A radiation-guiding layer 203 of InGaAsP with a composition corresponding to a radiation of 1.1 μm is present within a second and third region A, C between two further cladding layers 202, 204 of non-doped InP. The first and the second coupler 10, 20 are formed in this layer 203, the coupler gates 1, 2, 3, 4 having the form of waveguides here, which is also true for the connections of the first and second coupler 10, 20 to the active regions 31, 32. The semiconductor layer structure on the substrate 101 in this example has a mesa shape (see FIGS. 2 to 4) which means in this case that the semiconductor layers and part of the substrate 101 are absent outside a strip 300 and within three strips 301, 302, 303. The couplers 10, 20 and the laser 30 are formed by this mesa shape.

The length and width of the semiconductor body 100 in this example are 1500 and 300 μm, respectively. The width of the strip-shaped region 300 is 7 μm. The width of the voids 301, 302, 303 is 2 μm and their lengths are 200, 630, and 200 μm, respectively. The length of each of the regions A, B, C is 500 μm. The thickness of the cladding layers 102, 202 is approximately 0.2 μm, the layers 103, 203 are approximately 0.15 μm thick, the cladding layer 103 is approximately 2 μm thick, the contact layer 105 is approximately 0.5 μm thick, and the thickness of the cladding layer 204 is approximately 2.5 μm. The height of the mesa-shaped strip 300 is approximately 3 μm.

This embodiment of the device 100 is manufactured as follows, for example. First the following layers are provided on a substrate 101 of n-InP in that order, for example by MOVPE (=Metal Organic Vapour Phase Epitaxy): a first cladding layer 102 of n-InP, an active layer of InGaAsP (λ=1.3 μm), a second cladding layer 104 of p-InP, and a contact layer 105 of InGaAsP (λ=1.5 μm). Then a mask of $SiO_2$ is provided within a strip-shaped region B, whereupon the semiconductor layer structure is removed outside the strip-shaped region B by etching. In the regions A, C adjoining the region B, a further semiconductor layer structure is then provided by selective deposition, comprising a radiation-guiding layer 203 of InGaAsP (λ=1.1 μm) situated between two further cladding layers 202, 204 of non-doped InP. The layer thicknesses are so chosen here that the radiation-guiding layer 203 mergers into the active layer 103, and the upper side of the cladding layer 204 lies flush with the upper side of the contact layer 105.

After removal of the $SiO_2$ mask, a strip-shaped mask 300 of photoresist, with strip-shaped openings 301, 302, 303 therein, is provided over the entire structure so as to extend over the regions A, B, C. All semiconductor layers and a small portion of the substrate 101 are removed outside the mask 300 and within the openings 301, 302, 303 therein. After removal of the photoresist, an insulating $SiO_2$ layer 107 is provided within the region B. Openings are provided therein at the area of the contact layer 105. After this, the substrate 101 and—within the first region B—the upper side of the structure are provided with metal layers 106, 107. Finally, the mirror surfaces forming the outsides of the regions A and C are formed by cleaving. These mirror surfaces are provided with the antireflection layer 5 mentioned above. Finally, the individual devices 100 are obtained by once more cleaving, and are ready for final mounting.

A usual doping of approximately $10^{18}$ at/$cm^3$ is chosen for those semiconductor layers which are doped. The thicknesses and compositions of the semiconductor layers and the lateral dimensions of the semiconductor body are chosen as indicated above in the discussion of the device. Metal (multi)layers usual for the InP/InGaAsP material system are chosen for the metal layers 106, 107.

Figure 5:
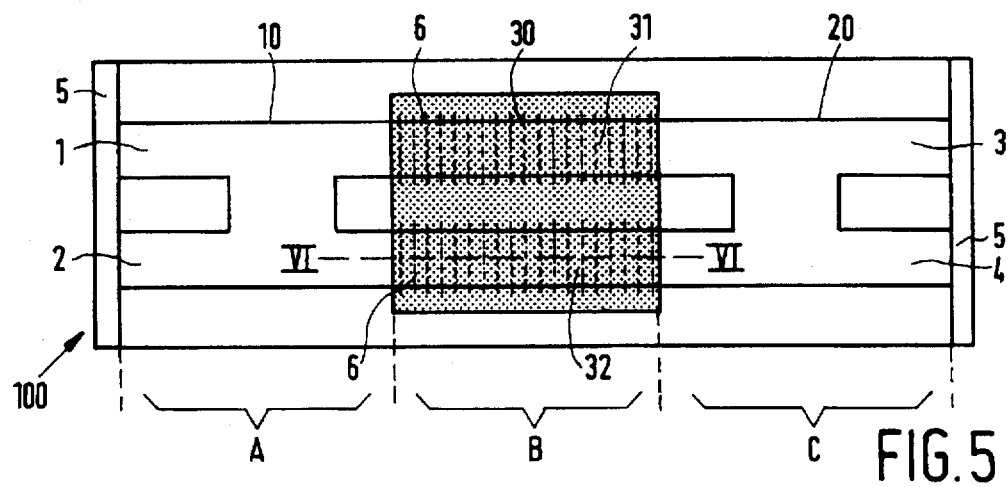
FIG. 5 diagrammatically and in plan view shows a second embodiment of a device according to the invention.
Figure 6:
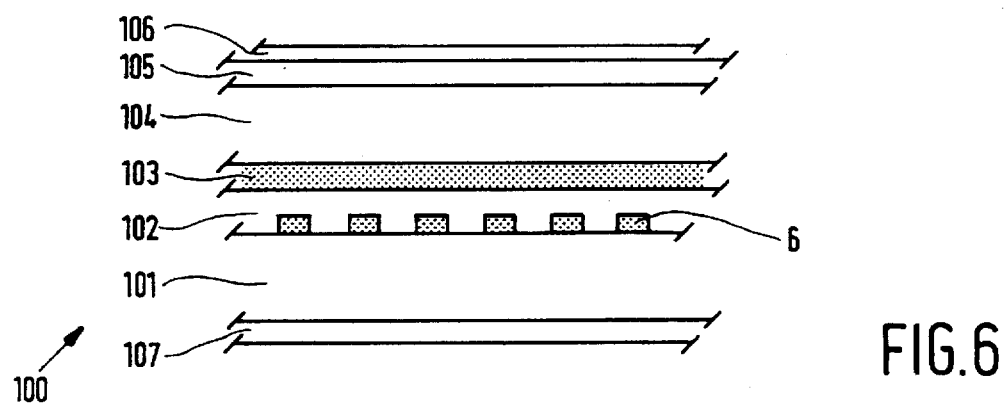
FIG. 6 shows the device of FIG. 5 diagrammatically and in cross-section taken on the line VI—VI.

FIG. 5 diagrammatically and in plan view shows a second embodiment of a device according to the invention, and FIG. 6 is a diagrammatic cross-section taken on the line VI—VI of the device of FIG. 5. In this example the device 100 is again a laser amplifier 100 which differs from the first embodiment in only one respect. The laser amplifier 100 is of the DFB/DBR type here. To achieve this, the active regions 31, 32 in the semiconductor body 100 of the first embodiment are provided with a periodic variation 6 in the effective refractive index in longitudinal direction in the form of a grating 6. This grating 6 comprises 0.07 μm thick strips of InGaAsP (λ=1.1 μm) with a period of approximately 0.2 μm which are present at the area of the first region B below the first cladding layer 102 at a distance of approximately 0.1 μm from the active layer. Reference is made to the discussion of the first embodiment for all other aspects.

The manufacture of this embodiment of the device 100 is substantially the same as that of the first embodiment of the device. Before the semiconductor layer structure is provided, an InGaAsP layer 6 of approximately 0.07 µm thickness and with a composition corresponding to radiation of 1.1 µm is provided on the substrate 101. This layer 6 is subsequently shaped into the grating 6 at the area of the first region B by means of photolithography and etching, and removed entirely outside this region. The manufacture further proceeds as described for the fast embodiment above.

The device 100 according to this embodiment forms a laser amplifier which is particularly suitable for certain applications in which the use of a DFB/DBR type laser amplifier is desired, but where adverse influences are suffered from the reflection occurring at the grating 6 of such an amplifier. An example of this is the polarization-insensitive amplifier device 1000 depicted in FIG. 7.

Figure 7:
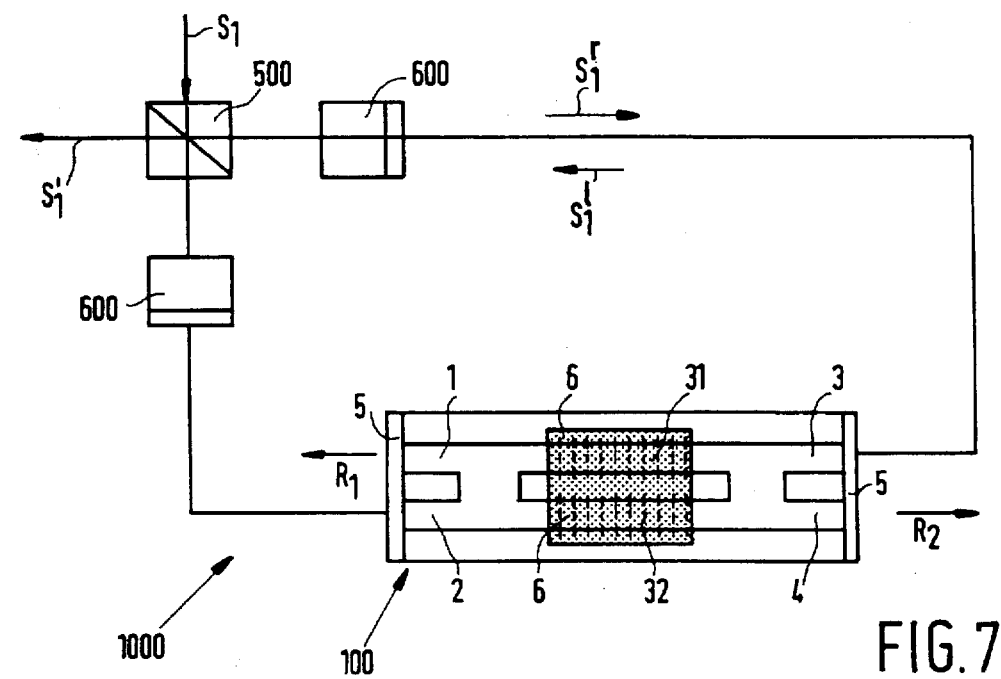
FIG. 7 diagrammatically shows a polarization-insensitive amplifier device comprising the device of FIG. 5.

FIG. 7 shows how an incoming radiation beam $S_1$ is split into two mutually perpendicular beams $S_1'$, $S_1''$, which traverse the second embodiment of the device 100 in anti-clockwise and clockwise direction, by a polarization beam splitter 500. The Faraday rotators 600 ensure that the two beams mentioned pass the device 100 with the correct polarization. The components of said beams amplified and transmitted by the device 100 are then joined together again by the splitter 500 to form the amplified radiation beam $S_1'$. Gates 2 and 3 were selected here for these components in passing through the device 100, the components moving diagonally through the device 100 thanks to the invention. Radiation $R_1$, $R_2$ reflected at the grating 6 and originating from radiation which enters the device 100 either at the second gate 2 or at the third gate 3 will also move diagonally through the device 100, but in this case from gate 1 to gate 4 or vice versa. The reflected radiation $R_1$, $R_2$ will accordingly leave the device 100 at these latter gates, and cannot interfere disadvantageously with the above components of the radiation beam $S_1$ mentioned above. If so desired, the reflected radiation $R_1$, $R_2$ may be detected by a monitor diode (not shown) at the first or fourth gate 1, 4 for feedback to control the amplifier 100.

Figure 8:
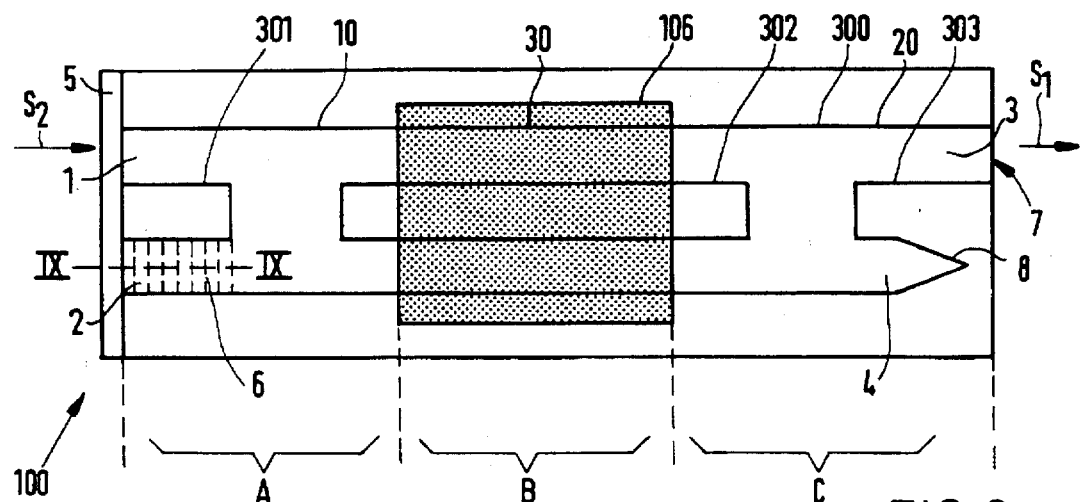
FIG. 8 diagrammatically and in plan view shows a third embodiment of a device according to the invention.
Figure 9:
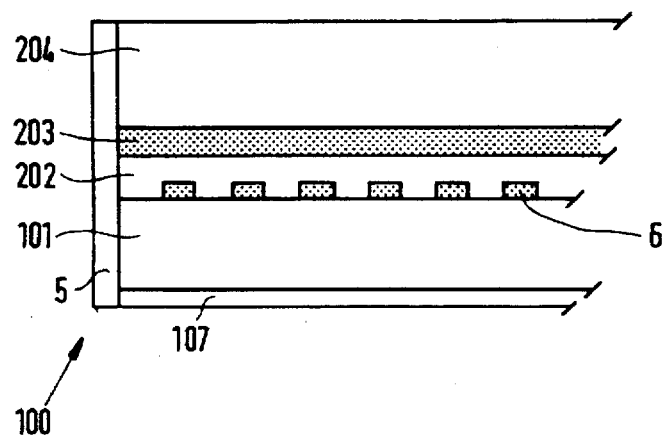
FIG. 9 shows the device of FIG. 8 diagrammatically and in cross-section taken on the line IX—IX.

FIG. 8 diagrammatically and in plan view shows a third embodiment of a device according to the invention. A diagrammatic cross-section of the device of FIG. 8 taken on the line IX—IX is shown in FIG. 9. The semiconductor device 100 in this example essentially has the same semiconductor body 100 as the first embodiment of the device. Reference is made to the discussion of FIGS. 1 to 4 for a discussion of its construction. In this embodiment of a device according to the invention, however, exclusively the first and second gates 1, 2 of the device 100 are provided with antireflection means 5, here again in the form of a 0.18 µm thick antireflection layer 5 of silicon oxynitride which is present on the mirror surfaces into which the gates 1, 2 issue. The second gate 2 here further comprises a waveguide which is provided with a periodic variation 6 in its refractive index in longitudinal direction. This here comprises a grating 6 as in the second embodiment. The mirror surface into which the third gate 3 issues is provided with reflection means 7, here formed by the transition between the semiconductor body 100 and the atmosphere (air or nitrogen). Finally, the fourth gate 4 of the device 100 in this example is provided with further means 8 for absorbing or scattering electromagnetic radiation. The further means 8 in this embodiment are formed by a tapering shape of the gate 4, seen in projection.

This embodiment of the device 100 forms an optically controllable laser. Given a sufficient current between the connections 106, 107, laser radiation will arise between the gates 2 and 3 whose wavelength $\lambda$ is determined by the period of the grating 6, for example, 1.305 µm in this case. The radiation emerges from the device 100 through gate 3 in the form of a beam $S_1$. During operation a second radiation beam $S_2$ is supplied to the device 100 through gate 1, whose wavelength is different from that of the beam $S_1$ before supply of $S_2$, for example, 1.310 µm. As the intensity of the second radiation beam $S_2$ rises, the intensity of the first beam $S_1$ will proportionally fall. The reverse takes place when the intensity of the second beam $S_2$ is reduced again. According to the invention, the radiation beam $S_1$ will not be polluted with radiation from the second radiation beam $S_2$. This is because the path of the second beam $S_2$ running from the first gate 1 to the fourth gate 4 is different from the path of the first beam $S_1$ which runs from the second gate 2 to the third gate 3.

The manufacture of this embodiment of the device 100 is substantially the same as that of the first embodiment. The differences only relate to the provision of a grating 6, the use of an adapted mask in forming the strip 300 and the void 303 therein, and the fact that the antireflection means 5 are provided at the areas of the gates 1, 2 only. As for the grating 6: this is formed in the same manner as in the second embodiment, outside the first region B after etching away of the semiconductor layer structure, and at the area of the second gate 2 before the further cladding layer 202 is provided.

Figure 10:
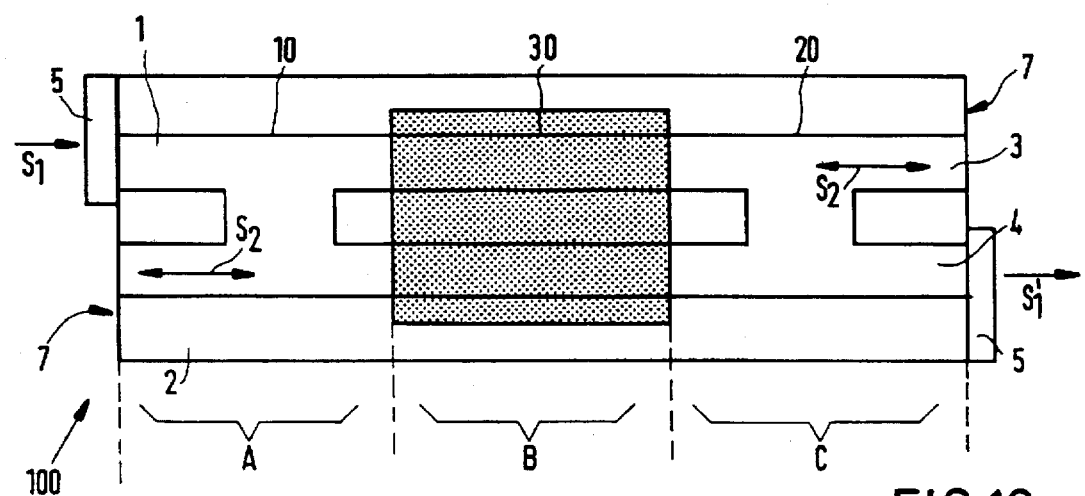
FIG. 10 diagrammatically and in plan view shows a fourth embodiment of a device according to the invention.

FIG. 10 diagrammatically and in plan view shows a fourth embodiment of a device according to the invention. This embodiment of the device 100 has exactly the same semiconductor body 100 as the first embodiment. Reference is made to the discussion of this embodiment above as regards the construction (composition and dimensions) thereof. In this embodiment of the device 100, the mirror surfaces defining the outsides of the regions A, C are provided with antireflection means 5 at the areas of the first gate 1 and the fourth gate 4 only. Furthermore, the second gate 2 and the third gate 3 are provided with reflection means 7, here in the form of a transition between the semiconductor body 100 and the atmosphere.

This embodiment of the device 100 forms a laser amplifier with a very good linearity. This is because a laser effect will arise between the gates 2, 3 of this embodiment of the device during its operation. When a radiation beam $S_1$ to be amplified crosses through the device, the dip in gain usual in a laser amplifier will not occur thanks to the maintenance of the concentrations of charge carriers in the device 100 owing to said laser effect. The advantages of the invention mentioned earlier appear to good effect also in this embodiment of the device 100. Indeed, the amplified beam $S_1'$ which leaves the device 100 through the fourth gate 4 is not polluted with radiation from the second beam $S_2$, which usually has a different wavelength from the first radiation beam $S_1$, thanks to the diagonal crossing of the beam $S_1$ to be amplified and the amplified beam $S_1'$ on the one hand and the radiation beam $S_2$ belonging to the laser operation. A filter for avoiding such a "pollution" is accordingly unnecessary, which is a major advantage in practice.

The manufacture of this embodiment of the device 100 is substantially the same as that of the first embodiment of the device. The difference only relates to the provision of an antireflection layer on the mirror surfaces which limit the outsides of the regions A and C, at the areas of the first gate 1 and the fourth gate 4, and reflection means 7 at the areas of the second gate 2 and third gate 3. This is achieved in that the gates 2, 3 are screened off by means of a mask during the provision of the antireflection layer 5.

The invention is not limited to the embodiments given since many modifications and variations are possible to those skilled in the art within the scope of the invention. Thus different semiconductor materials, compositions, and thicknesses may be used for the layers in the semiconductor body structure. It is also possible to use alternative structures, such as buried structures, for forming the active regions or couplers.

It is noted furthermore that alternative reflection or anti-reflection means may be used instead of those mentioned in the embodiments. Examples are a reflecting layer and a (slight) obliqueness of a gate relative to a mirror surface. The same is true for the means for absorbing or scattering electromagnetic radiation.

I claim:

1. An optoelectronic semiconductor device (100) comprising at least one semiconductor diode laser (30) with two mutually-parallel, strip-shaped active regions (31, 32) having substantially the same dimensions and comprising the same materials, whose ends are optically coupled at one side, characterized in that the ends of the active regions (31, 32) on both sides are coupled to a first and a second 3-dB radiation coupler (10, 20, respectively), wherein the first radiation coupler (10) forms a first (1) and a second gate (2) and the second radiation coupler (20) a third (3) and a fourth gate (4) for the device (100), and the geometry and material properties of the radiation couplers (10, 20) and the active regions (31, 32) are so chosen that electromagnetic radiation generated, amplified, or reflected in the device (100) during operation moves diagonally through the device (100) as a result of constructive interference.

2. A optoelectronic semiconductor device (100) comprising at least one semiconductor diode laser (30) with two mutually parallel, strip-shaped active regions (31, 32) whose ends are optically coupled at one side, characterized in that the ends of the active regions (31, 32) on both sides are coupled to a first and a second Multi Mode Interference radiation coupler (10, 20, respectively), wherein the first radiation coupler (10) forms a forms a first (1) and a second gate (2) and the second radiation coupler (20) a third (3) and a fourth gate (4) for the device (100), and the geometry and material properties of the radiation couplers (10, 20) and the active regions (31, 32) are so chosen that electromagnetic radiation generated, amplified, or reflected in the device (100) during operation moves diagonally through the device (100) as a result of constructive interference.

3. An optoelectronic semiconductor device (100) as claimed in claim 1, characterized in that the first, second, third, and fourth gates (1, 2, 3, 4) are provided with antireflection means (5), and in that the active regions (31, 32) are provided with a periodic variation (6) in their effective refractive index in the longitudinal direction.

4. An optoelectronic semiconductor device (100) as claimed in claim 1, characterized in that the first (1) and the second gate (2) are provided with antireflection means (5), the second gate (2) comprises a radiation waveguide (2) which is provided with a periodic variation (6) in its refractive index in longitudinal direction, the third gate (3) is provided with reflection means (7), and the fourth gate (4) is provided with further means (8) for absorbing or scattering electromagnetic radiation.

5. An optoelectronic semiconductor device (100) as claimed in claim 1, characterized in that the first (1) and the fourth gate (4) are provided with antireflection means (5), and the second (2) and the third gate (3) are provided with reflection means (7).

6. An optoelectronic semiconductor device (100) as claimed in claim 1 characterized in that the diode laser (30) and the two radiation couplers (10, 20) are integrated in a semiconductor body (100).

7. An optoelectronic semiconductor device (100) as claimed in claim 6, characterized in that the semiconductor body (100) comprises a semiconductor substrate (101) of a first conductivity type, on which substrate a first cladding layer (102) of the first conductivity type, an active layer (103), and a second cladding layer (104) of a second conductivity type opposed to the first are present within a first region (B), while the substrate (101) and the second cladding layer (104) are provided with electrical connection means (105, 106, 107) and two mutually parallel strip-shaped active regions (31, 32) are present within the active layer (103), and on which substrate, within a second (A) and third region (C) situated on either side of the first region (B), a radiation-guiding layer (203) is present which lies between two further cladding layers (202, 204), which adjoins the active layer (103) laterally, and in which a first radiation coupler (10) and a second radiation coupler (20) are formed, respectively.

8. An optoelectronic semiconductor device (100) as claimed in claim 7, characterized in that the semiconductor layers are situated within a first mesa-shaped strip (300) which extends over all three regions (A, B, C), and three further strips (301, 302, 303) are present within the first mesa-shaped strip (300) in the same extended direction, forming voids in the semiconductor layers, which further strips lie entirely within the first region (A), partly in the first (A), second (B), and third (C) region, and entirely within the third region (C), respectively.

* * * * *